United States Patent
Song et al.

(10) Patent No.: US 12,376,405 B2
(45) Date of Patent: Jul. 29, 2025

(54) IMAGE SENSOR WITH TRENCH STRUCTURES FILLED WITH A DIELECTRIC PATTERN AND OVERLAPPED BY A LIGHT SHIELD PATTERN

(71) Applicant: SAMSUNG ELECTRONICS CO., LTD., Suwon-si (KR)

(72) Inventors: Seunghyun Song, Suwon-si (KR); Junetaeg Lee, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 377 days.

(21) Appl. No.: 17/350,543

(22) Filed: Jun. 17, 2021

(65) Prior Publication Data
US 2022/0109014 A1    Apr. 7, 2022

(30) Foreign Application Priority Data
Oct. 6, 2020 (KR) .................. 10-2020-0128909

(51) Int. Cl.
H10F 39/00 (2025.01)

(52) U.S. Cl.
CPC ....... *H10F 39/807* (2025.01); *H10F 39/8053* (2025.01); *H10F 39/8057* (2025.01); *H10F 39/8063* (2025.01); *H10F 39/811* (2025.01)

(58) Field of Classification Search
CPC .......... H01L 27/1463; H01L 27/14621; H01L 27/14623; H01L 27/14627; H01L 27/14636; H10F 39/807; H10F 39/8063; H10F 39/8053; H10F 39/811; H10F 39/8057
See application file for complete search history.

(56) References Cited

U.S. PATENT DOCUMENTS

| | | | |
|---|---|---|---|
| 8,557,718 B2 | 10/2013 | Vermang | |
| 8,698,265 B2 | 4/2014 | Yoon | |
| 9,048,354 B2 | 6/2015 | Park et al. | |

(Continued)

FOREIGN PATENT DOCUMENTS

| JP | 2020-043265 A | 3/2020 |
|---|---|---|
| KR | 10-2020-0027248 A | 3/2020 |
| KR | 10-2020-0040617 A | 4/2020 |

OTHER PUBLICATIONS

Office Action dated Apr. 9, 2025 issued in corresponding Korean Patent Application No. 10-2020-0128909.

*Primary Examiner* — Andres Munoz
*Assistant Examiner* — Sean Ayers Winters
(74) *Attorney, Agent, or Firm* — MORGAN, LEWIS & BOCKIUS LLP

(57) ABSTRACT

Disclosed is an image sensor including a first substrate having first and second surfaces opposite to each other and including a pixel array area that includes unit pixel regions, a pad area that surrounds the pixel array area, and an optical black area between the pixel array area and the pad area, a dielectric pattern on the first surface of the first substrate, and a light-shield pattern on a top surface of the dielectric pattern on the optical black area. The first substrate includes first and second trenches recessed from the first surface. The dielectric pattern includes a first part filling the first trench and defining the unit pixel regions, a second part filling the second trench, and a third part on the first surface of the first substrate and connected to the first and second parts.

20 Claims, 15 Drawing Sheets

(56) References Cited

U.S. PATENT DOCUMENTS

| | | | |
|---|---|---|---|
| 9,281,328 B2 | 3/2016 | Ohno et al. | |
| 9,911,770 B2 | 3/2018 | Yang et al. | |
| 10,529,764 B2 | 1/2020 | Kobayashi et al. | |
| 10,991,741 B2 | 4/2021 | Tanaka et al. | |
| 10,991,742 B2 | 4/2021 | Han et al. | |
| 11,183,525 B2 | 11/2021 | Lim | |
| 2008/0303932 A1 | 12/2008 | Wang et al. | |
| 2014/0346628 A1* | 11/2014 | Okazaki | H01L 27/14645 257/432 |
| 2015/0194469 A1* | 7/2015 | Joei | H01L 27/14687 438/73 |
| 2016/0204144 A1* | 7/2016 | Lee | H01L 27/14643 257/432 |
| 2019/0221597 A1* | 7/2019 | Noh | H01L 27/14645 |
| 2020/0075643 A1* | 3/2020 | Han | H01L 27/1463 |
| 2020/0083263 A1* | 3/2020 | Tanaka | H01L 27/14603 |
| 2020/0243579 A1* | 7/2020 | Pyo | H01L 27/14627 |

\* cited by examiner

IMAGE SENSOR WITH TRENCH STRUCTURES FILLED WITH A DIELECTRIC PATTERN AND OVERLAPPED BY A LIGHT SHIELD PATTERN

CROSS-REFERENCE TO RELATED APPLICATION

This U.S. nonprovisional application claims priority under 35 U.S.C. § 119 to Korean Patent Application No. 10-2020-0128909 filed on Oct. 6, 2020 in the Korean Intellectual Property Office, the disclosure of which is incorporated by reference herein in its entirety.

TECHNICAL FIELD

The present inventive concepts relate to an image sensor, and more particularly, to an image sensor with trench structures disposed on a substrate.

DISCUSSION OF THE RELATED ART

An image sensor converts light into electrical signals. Recent advances in computer and communication industries have led to increased demand for high performance image sensors in various consumer electronic devices such as digital cameras, camcorders, PCSs (Personal Communication Systems), game devices, security cameras, medical micro cameras, and others.

Typical image sensors include charged coupled device (CCD) image sensors and CMOS image sensors. The CMOS image sensor may be simpler to operate and smaller in size than a CCD image sensor because its signal processing circuit is integrated into a single chip. Also, the CMOS image sensor requires relatively small power consumption, which is useful in battery-powered applications. In addition, since the manufacture of CMOS image sensors has well established processes, the use of CMOS image sensors may decrease fabrication cost for an electronic device. However, in some cases, CMOS sensors may suffer delamination failure in an area outside of the pixel array region during or after manufacture.

SUMMARY

Some example embodiments of the present inventive concepts provide an image sensor whose durability is increased.

According to some example embodiments of the present inventive concepts, an image sensor may include: a first substrate having a first surface and a second surface opposite to each other, the first substrate including a pixel array area that includes a plurality of unit pixel regions, a pad area that surrounds the pixel array area, and an optical black area between the pixel array area and the pad area; a dielectric pattern disposed on the first surface of the first substrate; and a light-shield pattern disposed on a top surface of the dielectric pattern on the optical black area. The first substrate may include a first trench and a second trench each of which is recessed from the first surface. The dielectric pattern may include: a first part that fills the first trench and defines the plurality of unit pixel regions; a second part that fills the second trench; and a third part on the first surface of the first substrate and connected to the first and second parts. The second part of the dielectric pattern may vertically overlap the light-shield pattern.

According to some example embodiments of the present inventive concepts, an image sensor may include: a first substrate having a first surface and a second surface opposite to each other, the first substrate including a first trench and a second trench each of which is recessed from the first surface; a plurality of color filters and a plurality of micro-lenses on the first surface of the first substrate and on a central portion of the first substrate; a plurality of contact pads disposed on the first surface of the first substrate, the plurality of contact pads surrounding the plurality of micro-lenses and the plurality of color filters in a plan view; a light-shield pattern disposed on the first surface of the first substrate and between the plurality of color filters and the plurality of contact pads; and a dielectric pattern that at least partially covers the first surface of the first substrate and vertically extends to fill the first and second trenches. The first trench may vertically overlap the plurality of color filters and the plurality of micro-lenses. The second trench may vertically overlap the light-shield pattern. A bottom surface of the first trench may be disposed at a level different from a level of a bottom surface of the second trench.

According to some example embodiments of the present inventive concepts, an image sensor may include: a first substrate having a first surface and a second surface that face each other, the first substrate including a pixel array area that includes a plurality of unit pixel regions, a pad area that surrounds the pixel array area, and an optical black area between the pixel array area and the pad area; a dielectric pattern disposed on the first surface of the first substrate; a plurality of gate patterns disposed on the second surface of the first substrate; a plurality of color filters and a plurality of micro-lenses disposed on the first surface of the first substrate on the pixel array area; a grid pattern between the plurality of color filters; a first wiring layer that at least partially covers the plurality of gate patterns and the second surface of the first substrate; and a light-shield pattern disposed on a top surface of the dielectric pattern on the optical black area. The first substrate may include a first trench and a second trench each of which is recessed from the first surface. The dielectric pattern may include: a first part that fills the first trench and defines the plurality of unit pixel regions; a second part that fills the second trench; and a third part on the first surface of the first substrate and connected to the first and second parts. The second part of the dielectric pattern may vertically overlap the light-shield pattern.

Objects of the present inventive concepts are not limited to the mentioned above, and other objects which have not been mentioned will be clearly understood to those skilled in the art from the following description.

DETAILED DESCRIPTION OF EMBODIMENTS

Figure 1:
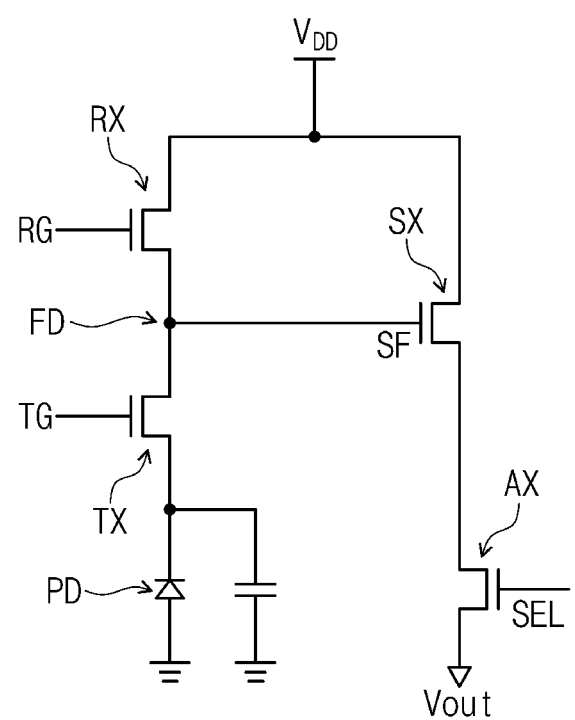
FIG. 1 illustrates a circuit diagram for an image sensor according to an example embodiment of the present inventive concepts.

In this description, like reference numerals may indicate like components. Further, description of a singular component may be applied to a plurality of the same components, unless context indicates otherwise. The following will now describe an image sensor according to some example embodiments of the present inventive concepts.

FIG. 1 illustrates a circuit diagram for an image sensor according to some example embodiments of the present inventive concepts.

Referring to FIG. 1, an image sensor may include unit pixel regions each including a photoelectric conversion section PD, a transfer transistor TX, a source follower transistor SX, a reset transistor RX, and a selection transistor AX. The transfer transistor TX, the source follower transistor SX, the reset transistor RX, and the selection transistor AX may respectively include a transfer gate TG, a source follower gate SF, a reset gate RG, and a selection gate SEL.

The photoelectric conversion section PD may be a photodiode that includes an n-type impurity region and a p-type impurity region. A floating diffusion section FD may serve as a drain of the transfer transistor TX. The floating diffusion section FD may serve as a source of the reset transistor RX. The floating diffusion section FD may be electrically connected to the source follower gate SF of the source follower transistor SX. The source follower transistor SX may be connected to the selection transistor AX.

An operation of the image sensor will be explained below with reference to FIG. 1. A power voltage VDD may be applied to a drain of the reset transistor RX and a drain of the source follower transistor SX under a light-blocked state, such that the reset transistor RX may be turned on to discharge charges that remain on the floating diffusion section FD. Thereafter, when the reset transistor RX is turned off and external light is incident on the photoelectric conversion section PD, electron-hole pairs may be generated from the photoelectric conversion section PD. Holes may be transferred to and accumulated on a p-type impurity region of the photoelectric conversion section PD, and electrons may be transferred to and accumulated on an n-type impurity region of the photoelectric conversion section PD. When the transfer transistor TX is turned on, charges such as electrons and holes may be transferred to and accumulated on the floating diffusion section FD. A gate bias of the source follower transistor SX may change responsive to an amount of the accumulated charges, and this may cause variation in source potential of the source follower transistor SX. In this case, when the selection transistor AX is turned on, charges may be read out as signals transmitted through a column line.

A wiring line may be electrically connected to one or more of the transfer gate TG, the source follower gate SF, the reset gate RG, and the selection gate SEL. The wiring line may be configured to apply the power voltage VDD to the drain of the reset transistor RX or the drain of the source follower transistor SX. The wiring line may include a column line connected to the selection transistor AX. The wiring line may be a conductive structure 210 which will be discussed below in FIG. 3.

FIG. 1 shows an example of a unit pixel that includes one photoelectric conversion section PD and four transistors TX, RX, AX, and SX, but embodiments of the present inventive concepts are not necessarily limited thereto. For example, the unit pixel may be provided in plural, and neighboring unit pixels may share one of the reset transistor RX, the source follower transistor SX, and the selection transistor AX. Therefore, the image sensor may have increased integration.

Figure 2:
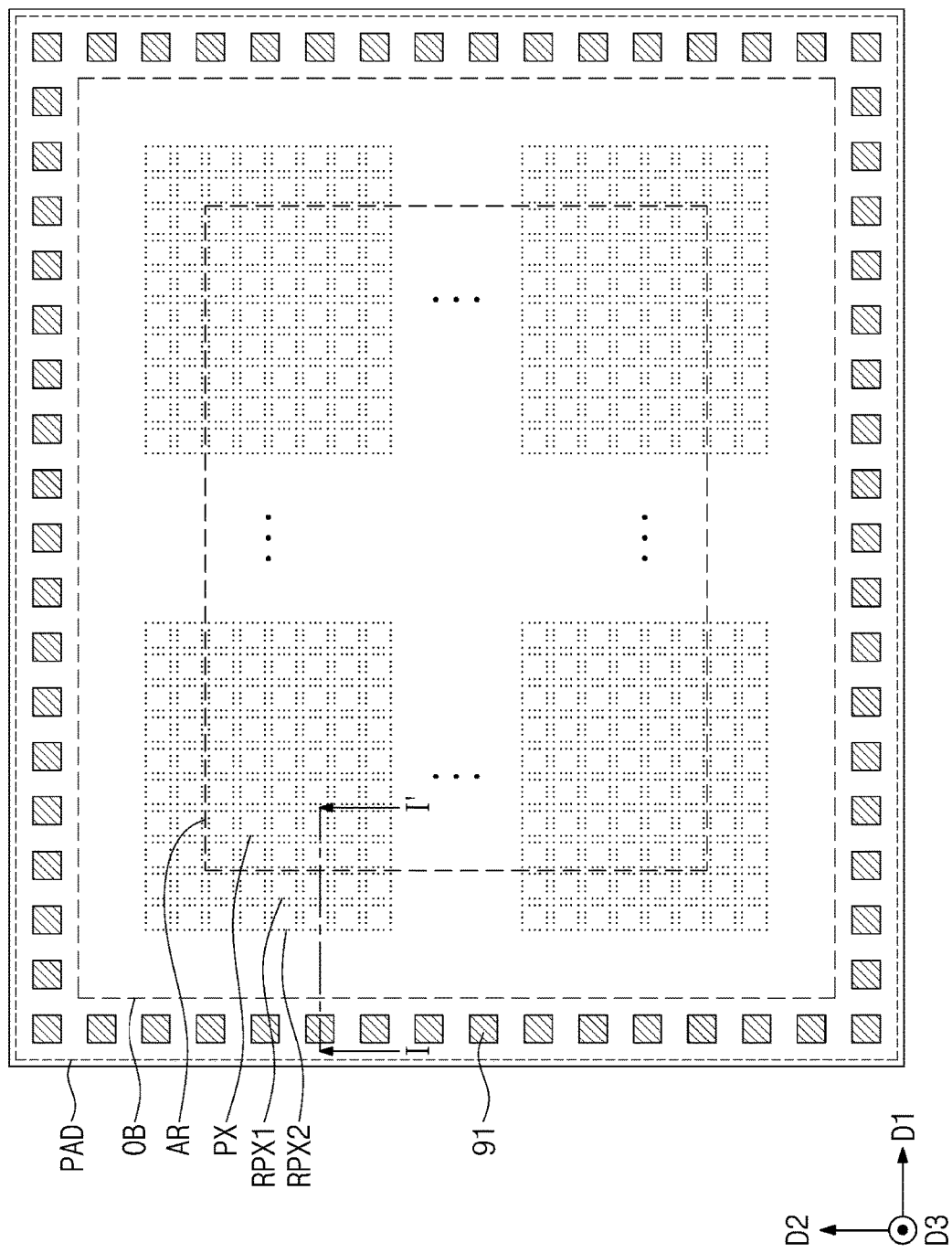
FIG. 2 illustrates an image sensor according to an example embodiment of the present inventive concepts in a plan view.
Figure 3:
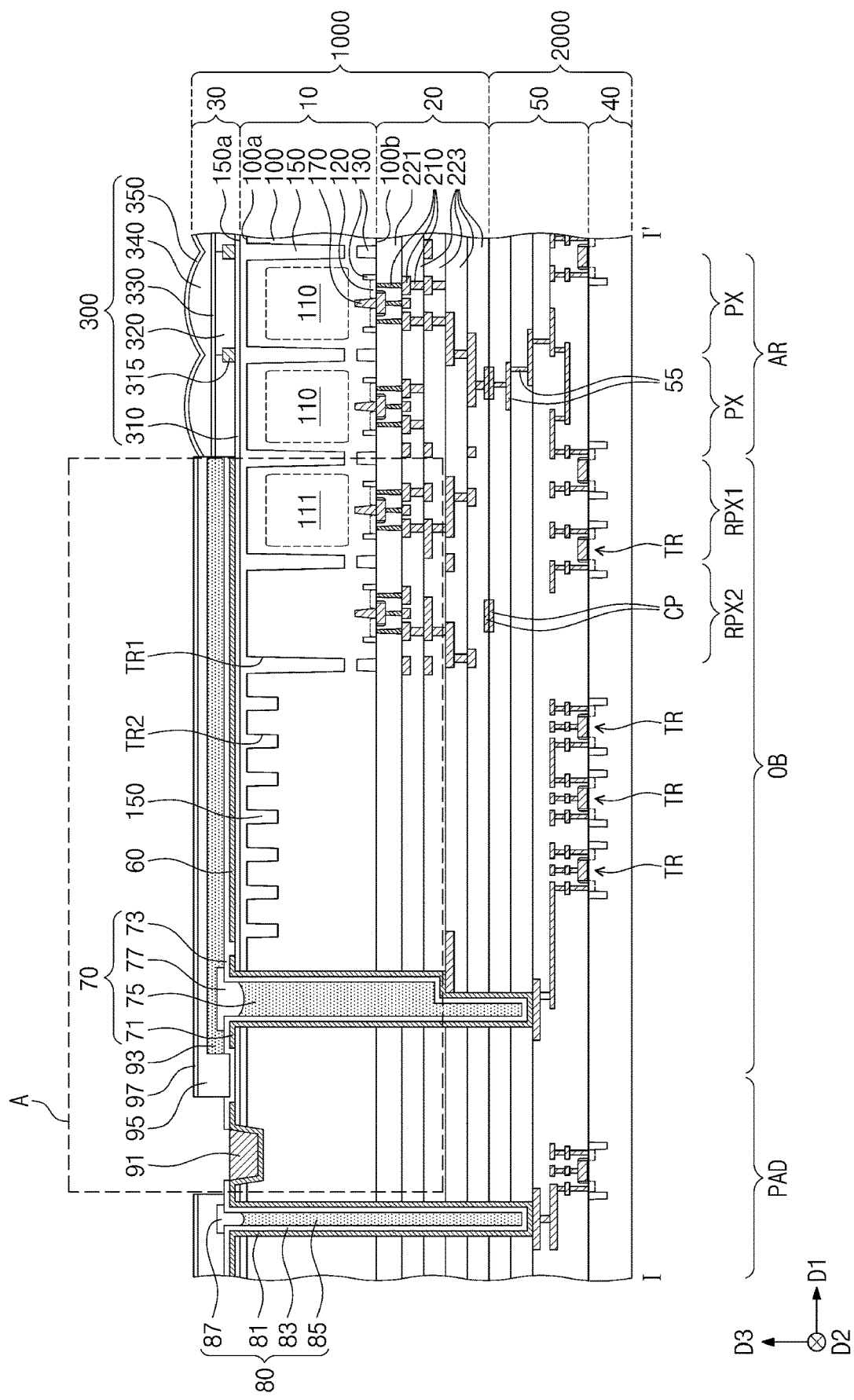
FIG. 3 is a cross-sectional view taken along line I-I' of FIG. 2.

FIG. 2 illustrates an image sensor according to an example embodiment of the present inventive concepts in a plan view. FIG. 3 is a cross-sectional view taken along line I-I' of FIG. 2.

Referring to FIGS. 2 and 3, an image sensor according to some example embodiments may include a sensor chip 1000 and a circuit chip 2000. The sensor chip 1000 may include a photoelectric conversion layer 10, a first wiring layer 20, and an upper layer 30. The photoelectric conversion layer 10 may include a first substrate 100, a device isolation pattern 130, a dielectric pattern 150, and gate patterns 170. The upper layer 30 may include a light-receiving part 300, a light-shield layer 60, a bulk color filter 93, an organic layer 95, and a coating layer 97.

The first substrate 100 may have a first surface 100a and a second surface 100b opposite to the first surface 100a. The first substrate 100 may receive light on the first surface 100a. The first wiring layer 20 may be disposed on the second surface 100b of the first substrate 100, and the upper layer 30 may be disposed on the first surface 100a of the first substrate 100. The substrate 100 may be a semiconductor substrate, and may be a silicon substrate or a silicon-on-insulator (SOI) substrate. The semiconductor substrate may include, for example, a silicon substrate, a germanium substrate, or a silicon-germanium substrate. The first substrate 100 may include first conductivity type impurities. For example, the first conductivity type impurities may include p-type impurities, such as one or more of aluminum (Al), boron (B), indium (In), and gallium (Ga).

The first substrate 100 may include a pixel array area AR, an optical black area OB, and a pad area PAD. When viewed in plan, the pixel array area AR may be disposed on a central portion of the first substrate 100. The pixel array area AR may include a plurality of unit pixel regions PX. The unit pixel regions PX may output photoelectric signals from incident light. The unit pixel regions PX may be two-dimensionally arranged in columns and rows. The rows may be parallel to a first direction D1. The columns may be parallel to a second direction D2. In this description, the first direction D1 may be parallel to the first surface 100a of the first substrate 100, and the second direction D2 may be parallel to the first surface 100a of the first substrate 100 and may intersect the first direction D1. For example, the second direction D2 may be substantially orthogonal to the first direction D1. A third direction D3 may intersect each of the first and second directions D1 and D2. For example, the third direction D3 may be a direction normal to the first surface 100a. The following will sequentially discuss detailed structures of the pixel array area AR, the optical black area OB, and the pad area PAD of the image sensor.

On the pixel array area AR, the first substrate 100 may include a plurality of unit pixel regions PX defined by the dielectric pattern 150. The plurality of unit pixel regions PX may be arranged in a matrix shape along first and second directions D1 and D2. The first substrate 100 may include photoelectric conversion sections 110. In the first substrate 100, the photoelectric conversion sections 110 may be disposed on corresponding unit pixel regions PX. The photoelectric conversion sections 110 may each have the same function and role as the photoelectric conversion section PD shown in FIG. 1. The photoelectric conversion sections 110 may be areas where the first substrate 100 is doped with second conductivity type impurities. The second conductivity type impurities may have a conductivity type opposite to that of the first conductivity type impurities. The second conductivity type impurities may include n-type impurities, such as one or more of phosphorus (P), arsenic (As), bismuth (Bi), and antimony (Sb). The photoelectric conversion sections 110 may be adjacent to the second surface 100b of the first substrate 100. In such a configuration, the photoelectric conversion sections 110 may be closer to the second surface 100b than to the first surface 100a. Alternatively, each of the photoelectric conversion sections 110 may include a first zone adjacent to the first surface 100a and a second zone adjacent to the second surface 100b. The photoelectric conversion section 110 may have a difference in impurity concentration between the first zone and the second zone. Therefore, the photoelectric conversion section 110 may have a potential slope between the first and second surfaces 100a and 100b of the first substrate 100. Alternatively, the photoelectric conversion section 110 may have no potential slope between the first and second surfaces 100a and 100b of the first substrate 100.

The first substrate 100 and the photoelectric conversion sections 110 may constitute photodiodes. For example, a photodiode may include a p-n junction between the first substrate 100 of the first conductivity type and the photoelectric conversion section 110 of the second conductivity type. The photoelectric conversion section 110 that constitutes the photodiode may generate and accumulate photocharges in proportion to intensity of incident light.

The dielectric pattern 150 may be disposed on the first surface 100a of the first substrate 100. The dielectric pattern 150 may penetrate at least a portion of the first substrate 100. The dielectric pattern 150 will be further discussed in detail below.

The device isolation pattern 130 may be provided in the first substrate 100. For example, the device isolation pattern 130 may be provided in a device isolation trench, and the device isolation trench may be recessed from the second surface 100b of the first substrate 100. The device isolation pattern 130 may be a shallow trench isolation (STI) layer. The device isolation pattern 130 may expose the second surface 100b of the first substrate 100. The device isolation pattern 130 may define positions where impurity regions 120 disposed on the second surface 100b of the first substrate 100 are disposed. The device isolation pattern 130 may have a width that gradually decreases with distance from the second surface 100b of the first substrate 100. The device isolation pattern 130 may be vertically spaced apart from the photoelectric conversion sections 110. The device isolation pattern 130 may include one or more of silicon oxide, silicon nitride, and silicon oxynitride.

The gate patterns 170 may be disposed on the second surface 100b of the first substrate 100. The gate patterns 170 may have a buried structure. For example, each of the gate patterns 170 may have a horizontal part and a protruding part. The protruding part may protrude into the first substrate 100. The protruding part may vertically extend and have a major axis parallel to the third direction D3. The horizontal part may be disposed on the second surface 100b of the first substrate 100. The horizontal part may be connected to the protruding part. The horizontal and protruding parts may include the same material. For example, the horizontal and protruding parts may include metal, metal silicide, polysilicon, or a combination thereof. In this case of polysilicon, the polysilicon may include doped polysilicon.

When viewed in plan, the gate patterns 170 may be disposed on corresponding unit pixel regions PX. The gate patterns 170 may not vertically overlap the dielectric pattern 150. The gate patterns 170 may serve as gate electrodes of the transfer transistor TX, the source follower transistor SX, the reset transistor RX, and the selection transistor AX discussed above in FIG. 1. For example, the gate patterns 170 may include the transfer gate TG, the source follower gate SF, the reset gate RG, and the selection gate SEL.

The first wiring layer 20 may be disposed on the second surface 100b of the first substrate 100. The first wiring layer 20 may include dielectric layers 221 and 223 and a conductive structure 210. The dielectric layers 221 and 223 may include a first dielectric layer 221 and second dielectric layers 223. The first dielectric layer 221 may cover the second surface 100b of the first substrate 100. The first dielectric layer 221 may be disposed on the second surface 100b of the first substrate 100, thereby covering the gate patterns 170. The second dielectric layers 223 may be stacked on the first dielectric layer 221. The first and second dielectric layers 221 and 223 may include a non-conductive material. For example, the first and second dielectric layers 221 and 223 may include a silicon-based dielectric material, such as one or more of silicon oxide, silicon nitride, and silicon oxynitride. The conductive structure 210 may be provided in the dielectric layers 221 and 223. The conductive structure 210 may include a contact plug part, a line part, and a via part. The contact plug part may be provided in the first dielectric layer 221 and electrically connected to either of the gate pattern 170 and the impurity region 120. The line part of the conductive structure 210 may be interposed between two adjacent layers of the first and second dielectric layers 221 and 223. The line part may be connected to the contact plug part. The via part of the conductive structure 210 may be connected to the line part, while penetrating at least one of the second dielectric layers 223. The contact plug part of the conductive structure 210 may include a different material than the line and via parts. For example, the line and via parts may include a metallic material, such as copper (Cu), and the contact plug part may include a metallic material, such as tungsten (W).

The light-receiving part 300 may be disposed on a top surface 150a of the dielectric pattern 150. The light-receiving part 300 may be disposed on the pixel array area AR of the first substrate 100. The light-receiving part 300 may include an antireflective layer 310, a grid pattern 315, color filters 320, a backside dielectric layer 330, micro-lenses 340, and a lens coating layer 350. The light-receiving part 300 may focus and filter externally incident light, and direct it to the photoelectric conversion layer 10.

For example, the color filters 320 and the micro-lenses 340 may be disposed on the first surface 100a of the first substrate 100. The color filters 320 may be disposed on corresponding unit pixel regions PX. The micro-lenses 340 may be disposed on corresponding color filters 320. The antireflective layer 310 may be provided between the color filters 320 and the first surface 100a of the first substrate 100. The antireflective layer 310 may cover the top surface 150a of the dielectric pattern 150. The antireflective layer 310 may prevent light reflection to allow the photoelectric conversion sections 110 to readily receive light incident onto the first surface 100a of the first substrate 100. The backside dielectric layer 330 may be provided between the color filters 320 and the micro-lenses 340. The backside dielectric layer 330 may include one or more of a fixed charge layer, an adhesive layer, and a protective layer. The backside dielectric layer 330 may include a plurality of layers, and may include metal oxide (e.g., aluminum oxide or hafnium oxide) or silicon-based dielectric (e.g., silicon oxide or silicon nitride).

The color filters 320 may correspond to the plurality of unit pixel regions PX. The color filters 320 may include primary color filters. The color filters 320 may include first, second, and third color filters that are transparent to different colors. For example, the first color filter, the second color filter, and the third color filer may be respectively transparent to green light, red light, and blue light. The first, second, and third color filters may be arranged in a Bayer pattern format. In another example, the first, second, and third color filters may be transparent to other colors such as cyan, magenta, or yellow.

The micro-lenses 340 may be disposed on corresponding color filters 320. The micro-lenses 340 may vertically overlap corresponding photoelectric conversion sections 110. The micro-lenses 340 may be connected to each other. The micro-lenses 340 may be substantially transparent to light. Each of the micro-lenses 340 may have a convex shape to focus incident light onto the unit pixel region PX. The micro-lenses 340 may include an organic material. For example, the micro-lenses 340 may include a photoresist material or a thermosetting resin.

The lens coating layer 350 may be disposed on surfaces of the micro-lenses 340. The lens coating layer 350 may conformally cover convex surfaces of the micro-lenses 340. The lens coating layer 350 may include a dielectric material and may be transparent. The lens coating layer 350 may protect the micro-lenses 340.

The following will discuss components on the optical black area OB of the first substrate 100.

On the optical black area OB, the first substrate 100 may include a first reference pixel region RPX1 and a second reference pixel region RPX2 that are defined by the dielectric pattern 150. The first reference pixel region RPX1 may be disposed between the second reference pixel region RPX2 and the pixel array area AR. The photoelectric conversion section 111 may be provided in the first reference pixel region RPX1. The first reference pixel region RPX1 may include a photoelectric conversion section 111 that has a planar area and a volume the same as the planar area and volume of each of the photoelectric conversion sections 110 on the unit pixel region PX. The photoelectric conversion section 111 may not be disposed on the second reference pixel region RPX2. The impurity regions 120, the gate patterns 170, and the device isolation patterns 130 may be disposed on the first and second reference pixel regions RPX1 and RPX2. The impurity regions 120, the gate patterns 170, and the device isolation patterns 130 may be the same as those on the pixel array area AR.

On the optical black area OB, the antireflective layer 310 may be disposed on the first surface 100a of the first substrate 100. The antireflective layer 310 may be disposed on the top surface 150a of the dielectric pattern 150. The antireflective layer 310 may horizontally extend from the pixel array area AR toward the optical black area OB, thereby covering the top surface 150a of the dielectric pattern 150.

On the optical black area OB, the light-shield layer 60 may be disposed on the first surface 100a of the first substrate 100. The light-shield layer 60 may be disposed on a top surface of the antireflective layer 310. The light-shield layer 60 may horizontally extend to contact a lateral surface of the color filter 320 on the pixel array area AR. The light-shield layer 60 may prevent light from entering the photoelectric conversion section 111 on the optical black area OB. On the optical black area OB, the first and second reference pixel regions RPX1 and RPX2 may have pixels that output noise signals without outputting photoelectric signals. The noise signal may be generated from electrons produced by heat or dark current. The light-shield layer 60 may not cover the pixel array area AR, and thus light may enter the photoelectric conversion section 110 on the pixel array area AR. The noise signals may be removed from photoelectric signals that are output from the pixel regions PX. The light-shield layer 60 may include metal, such as tungsten, copper, aluminum, or any alloy thereof.

The optical black area OB may include a first through structure 70 disposed on the first substrate 100. The first through structure 70 may include a first conductive pattern 71, a first through dielectric layer 73, a first buried pattern 75, and a first capping pattern 77.

A first through hole may be formed on the first surface 100a of the first substrate 100, and the first conductive pattern 71 may be disposed in the first through hole. The first through hole may be disposed on a first side of a contact pad 91. The first through hole may be disposed between the contact pad 91 and the dielectric pattern 150. The first through hole may penetrate the first substrate 100, the first wiring layer 20, and at least a portion of the second wiring layer 50. The first through hole may have a first bottom surface and a second bottom surface. The first bottom surface of the first through hole may expose the line part of the conductive structure 210. The second bottom surface of the first through hole may expose a lower line 55 in the second wiring layer 50.

The first conductive pattern 71 may cover a portion of the top surface of the antireflective layer 310, and may conformally cover an inner sidewall and the first and second bottom surface of the first through hole. The first conductive pattern 71 may penetrate the first substrate 100, the first wiring layer 20, and at least a portion of the second wiring layer 50. For example, the first conductive pattern 71 may be in contact with and electrically connected to the line part of the conductive structure 210 in the first wiring layer 20. The first conductive pattern 71 may be in contact with and electrically connected to the lower line 55 in the second wiring layer 50. The first conductive pattern 71 may include a metallic material, such as copper, tungsten, or aluminum.

The first through dielectric layer 73 may be disposed on the first conductive pattern 71. The first through dielectric layer 73 may extend conformally to cover the inner sidewall of the first through hole. The first through dielectric layer 73 may extend onto the first surface 100a of the first substrate 100, and may cover the light-shield layer 60 and a portion of a second conductive pattern 81 which will be discussed below. The first through dielectric layer 73 may contact lateral surfaces of the color filters 320. The first through dielectric layer 73 may include a dielectric material, such as silicon oxide, aluminum oxide, hafnium oxide, silicon nitride, or silicon oxynitride.

The first buried pattern 75 may be disposed on the first through dielectric layer 73, thereby filling a remaining portion of the first through hole. The first buried pattern 75 may not extend onto the first surface 100a of the first substrate 100. The first buried pattern 75 may include a material with a low refractive index and that may have dielectric characteristics. The first buried pattern 75 may have a recession on a top surface thereof. For example, the top surface of the first buried pattern 75 may have a central portion located at a lower level than that of an edge portion of the top surface of the first buried pattern 75.

The first capping pattern 77 may be disposed on the top surface of the first buried pattern 75, thereby filling the recession. The first capping pattern 77 may have a top surface that is substantially flat. The first capping pattern 77 may include a dielectric polymer, such as a photoresist material.

The bulk color filter 93 may cover the first through dielectric layer 73 and the first capping pattern 77. The bulk color filter 93 may be, for example, a blue color filter. The bulk color filter 93 may vertically overlap the light-shield layer 60.

The following description pertains to components on the pad area PAD of the first substrate 100.

On the pad area PAD, a contact pad trench may be formed on the first surface 100a of the first substrate 100, and the contact pad 91 may be provided in the contact pad trench. The contact pad 91 may include a metallic material, such as aluminum. When the image sensor operates, the contact pad 91 may serve as an electrical connection path between the image sensor and external components. For example, the contact pad 91 may externally output electrical signals generated in the unit pixel regions PX.

A second through structure 80 may be disposed on the pad area PAD of the first substrate 100. The second through structure 80 may include a second conductive pattern 81, a second through dielectric layer 83, a second buried pattern 85, and a second capping pattern 87.

A second through hole may be formed on the first surface 100a of the first substrate 100, and the second conductive pattern 81 may be provided in the second through hole. The second through hole may be disposed on a second side of the contact pad 91. The second side of the contact pad 91 may be different from the first side of the contact pad 91. The second through hole may penetrate the first substrate 100, the first wiring layer 20, and at least a portion of the second wiring layer 50. The second through hole may have a bottom surface that exposes the lower line 55 in the second wiring layer 50.

On the pad area PAD, the second conductive pattern 81 may be disposed on the first surface 100a of the first substrate 100. The second conductive pattern 81 may conformally cover an inner sidewall and a bottom surface of the contact pad trench. The second conductive pattern 81 may further extend into the second through hole to conformally cover an inner sidewall and the bottom surface of the second through hole. The second conductive pattern 81 may be electrically connected to the contact pad 91. The second conductive pattern 81 may penetrate the first substrate 100, the first wiring layer 20, and at least a portion of the second wiring layer 50. For example, the second conductive pattern 81 may be in contact with and electrically connected to the lower line 55 in the second wiring layer 50. The second conductive pattern 81 may include a metallic material, such as copper, tungsten, or aluminum.

The second through dielectric layer 83 may be disposed on the second conductive pattern 81. The second through dielectric layer 83 may conformally extend to cover the inner sidewall of the second through hole. The second through dielectric layer 83 may extend onto the first surface 100a of the first substrate 100. The second through dielectric layer 83 may not cover a top surface of the contact pad 91. The second through dielectric layer 83 may not extend to cover a portion of the contact pad trench. The second through dielectric layer 83 may include a dielectric material, such as silicon oxide, aluminum oxide, hafnium oxide, silicon nitride, or silicon oxynitride.

The second buried pattern 85 may be disposed on the second through dielectric layer 83, thereby filling a remaining portion of the second through hole. The second buried pattern 85 may not extend onto the first surface 100a of the first substrate 100. The second buried pattern 85 may include the same material as that of the first buried pattern 75. The second buried pattern 85 may have a recession on a top surface thereof. For example, the top surface of the second buried pattern 85 may have a central portion located at a lower level than that of an edge portion of the top surface of the second buried pattern 85.

The second capping pattern 87 may be disposed on the top surface of the second buried pattern 85, thereby filling the recession. The second capping pattern 87 may have a top surface that is substantially flat. The second capping pattern 87 may include a dielectric polymer, such as a photoresist material.

On the optical black area OB and the pad area PAD, the organic layer 95 may be disposed on the first surface 100a of the first substrate 100. The organic layer 95 may cover a top surface of the first through dielectric layer 73 and a top surface of the bulk color filter 93, and on the pad area PAD, the organic layer 95 may cover the second through dielectric layer 83 and the second capping pattern 87, but may not cover the top surface of the contact pad 91. Therefore, the top surface of the contact pad 91 may be externally exposed. The organic layer 95 may be transparent. The organic layer 95 may have a top surface that is substantially flat. The organic layer 95 may include, for example, a polymer. The organic layer 95 may have dielectric characteristics. In some embodiments, the organic layer 95 may be connected to the micro-lenses 340. The organic layer 95 may include the same material as that of the micro-lenses 340.

A coating layer 97 may be disposed on the organic layer 95. The coating layer 97 may conformally cover the top surface of the organic layer 95. The coating layer 97 may include a dielectric material and may be transparent. The coating layer 97 may include the same material as that of the lens coating layer 350.

Figure 4A:
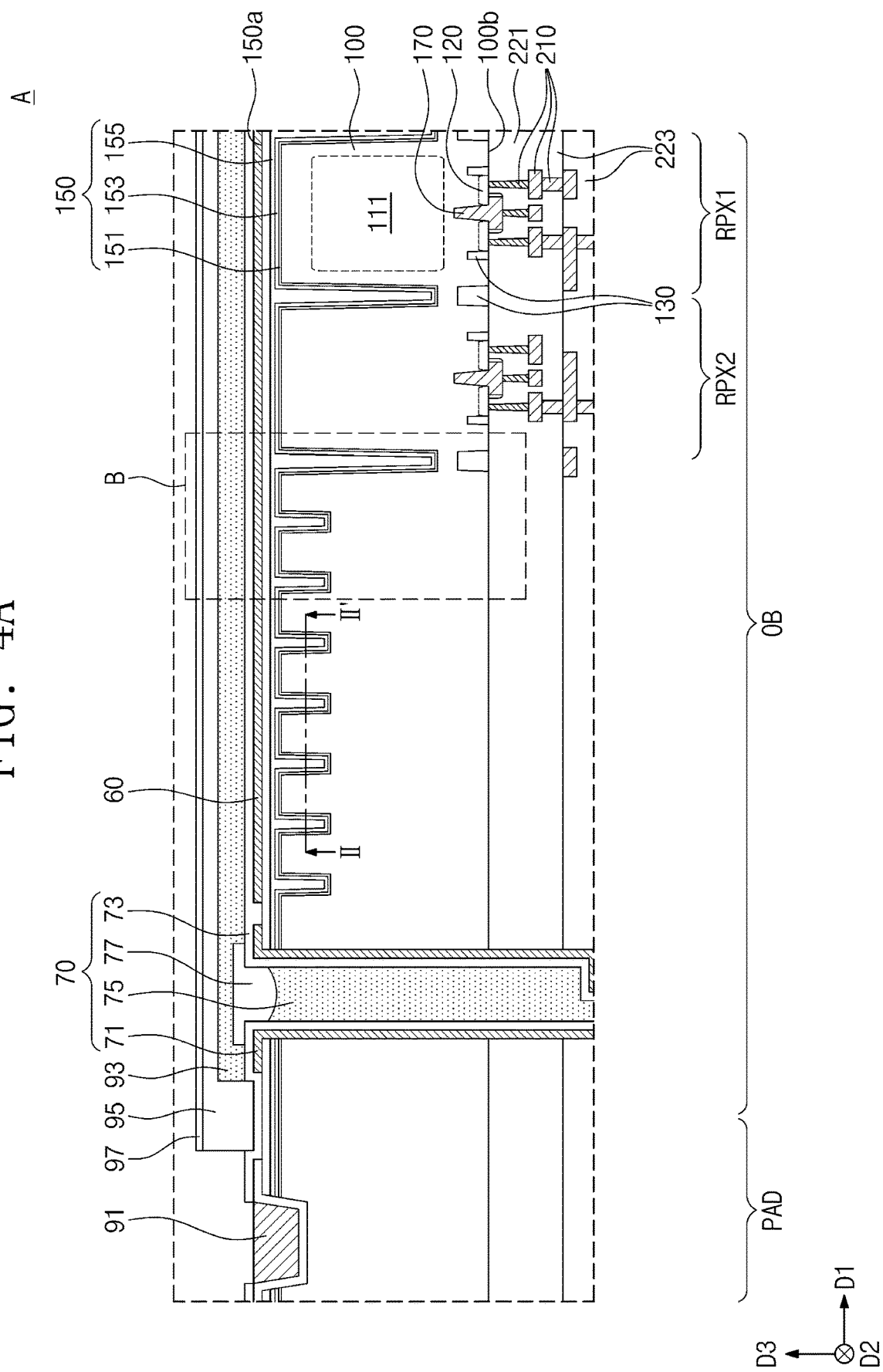
FIG. 4A is an enlarged view of section A of FIG. 3.
Figure 4B:
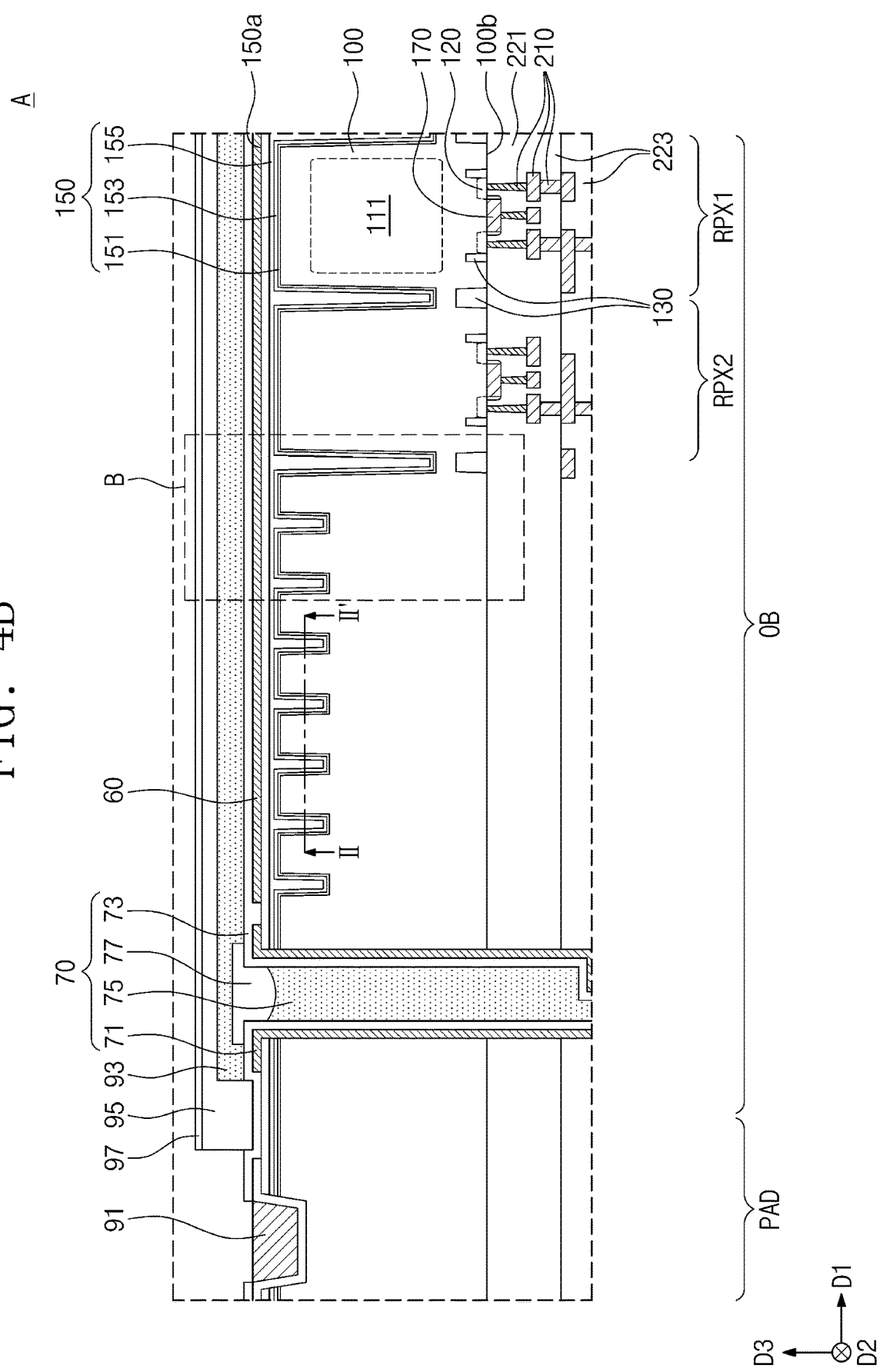
FIG. 4B is an enlarged view of section A of FIG. 3 according to another embodiment of the present inventive concepts.
Figure 5:
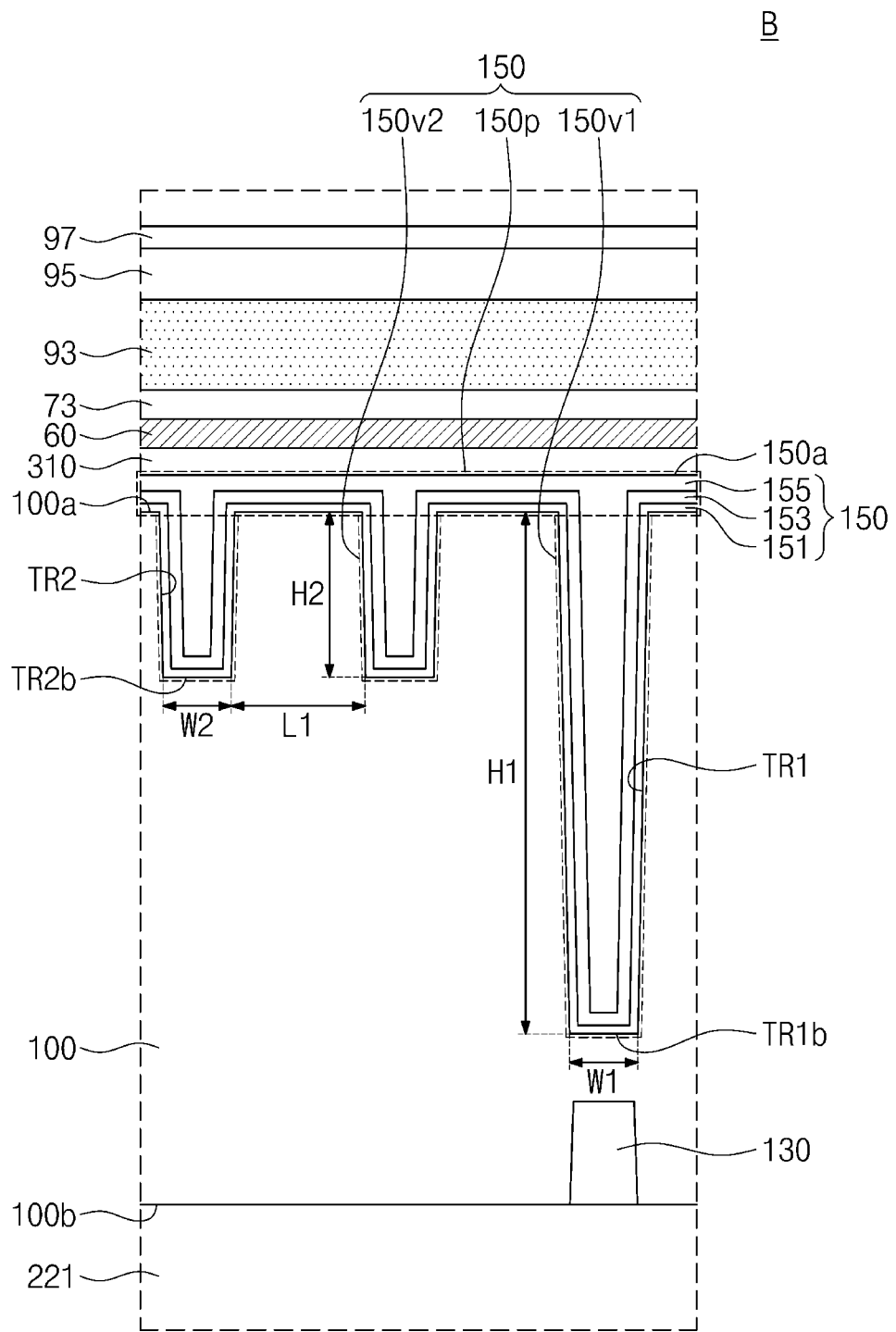
FIG. 5 is an enlarged view showing section B of FIG. 4A.
Figure 6:
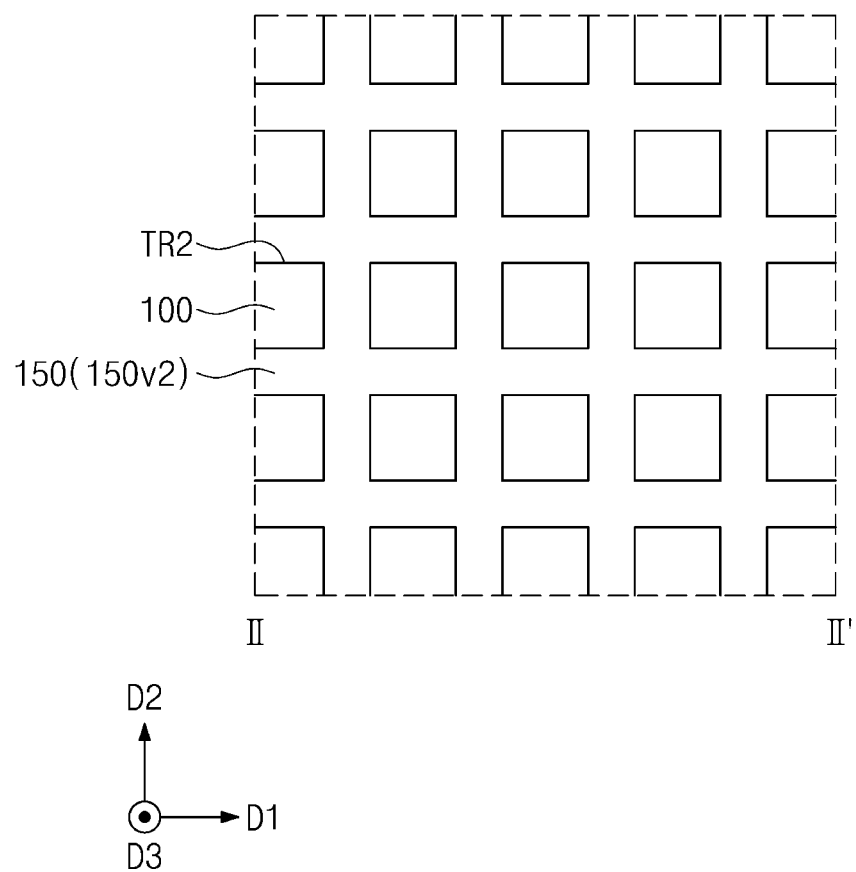
FIG. 6 is a plan view taken along line II-II' of FIG. 4A or 4B.
Figure 7:
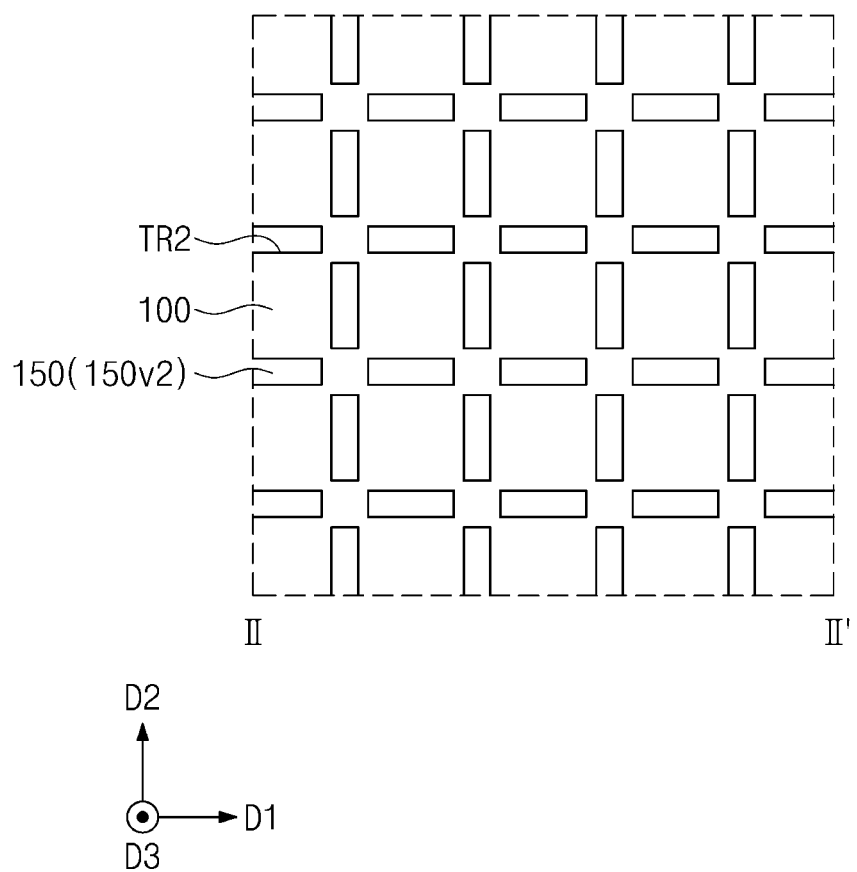
FIGS. 7 and 8 are plan views taken along line II-II' of FIG. 4A or 4B, showing an image sensor according to other embodiments of the present inventive concepts.
Figure 8:
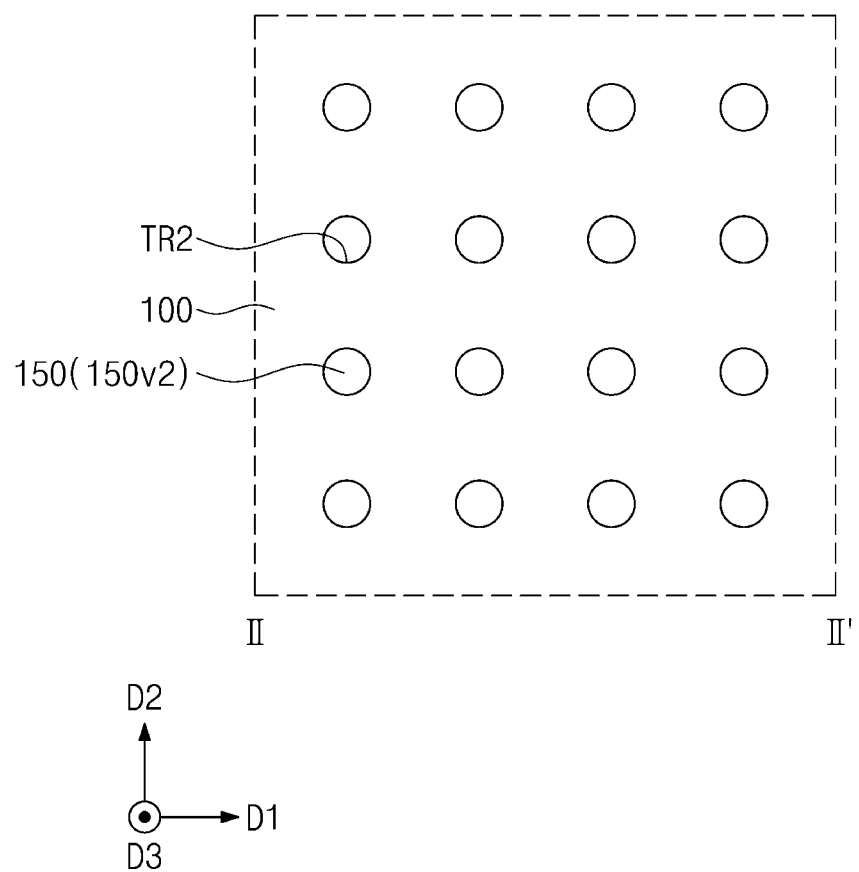

FIG. 4A is an enlarged view showing section A of FIG. 3. FIG. 5 is an enlarged view showing section B of FIG. 4A or 4B. FIG. 6 is a plan view taken along line II-II' of FIG. 4A or 4B. FIGS. 7 and 8 are plan views taken along line II-II' of FIG. 4A or 4B, showing an image sensor according to example embodiments of the present inventive concepts. The following will describe in detail the dielectric pattern 150 according to some example embodiments.

Referring to FIGS. 3, 4A, and 5, the first substrate 100 may have a first trench TR1 and a second trench TR2 that are recessed from the first surface 100a. The first trench TR1 may be disposed on the pixel array area AR and the optical black area OB of the first substrate 100. The second trench TR2 may be disposed on the optical black area OB of the first substrate 100. When viewed in plan, the second trench TR2 may surround the first trench TR1. The first trench TR1 and the second trench TR2 may have respective bottom surfaces TR1b and TR2b, where each of which is located at a level between the first and second surfaces 100a and 100b of the first substrate 100. For example, the bottom surface TR1b of the first trench TR1 may be located at a level lower than that of the bottom surface TR2b of the second trench TR2. In such a configuration, the bottom surface TR1b of the first trench TR1 may be closer than the bottom surface TR2*b* of the second trench TR2 to the second surface 100*b* of the first substrate 100.

On the pixel array area AR and the optical black area OB, the dielectric pattern 150 may be disposed on the first surface 100*a* of the first substrate 100. The dielectric pattern 150 may include a first part 150*v*1 provided in the first trench TR1, a second part 150*v*2 provided in the second trench TR2, and a third part 150*p* that covers the first surface 100*a* of the first substrate 100 and is connected to the first and second parts 150*v*1 and 150*v*2.

The first part 150*v*1 of the dielectric pattern 150 may be provided in the first substrate 100, and may define the unit pixel regions PX on the pixel array area AR and may also define the first and second reference pixel regions RPX1 and RPX2 on the optical black area OB. For example, the first part 150*v*1 may be provided between the unit pixel regions PX of the first substrate 100, between the unit pixel regions PX and the first reference pixel regions RPX1, and between the first reference pixel regions RPX1 and the second reference pixel regions RPX2. The first part 150*v*1 may have a grid or lattice structure when viewed in plan. When viewed in plan, the first part 150*v*1 may surround the unit pixel regions PX and the first and second reference pixel regions RPX1 and RPX2.

The first part 150*v*1 may be disposed on a central portion of the first substrate 100. The first part 150*v*1 may overlap vertically with the light-receiving part 300. The first part 150*v*1 may have a segment that surrounds the first and second reference pixel regions RPX1 and RPX2, and the segment of the first part 150*v* may overlap vertically with the light-shield layer 60, the first through dielectric layer 73, the bulk color filter 93, the organic layer 95, and the coating layer 97.

The first part 150*v*1 may vertically extend from the first surface 100*a* toward the second surface 100*b* of the first substrate 100. For example, the first part 150*v*1 may have a width that gradually decreases as it extends towards the second surface 100*b* from the first surface 100*a* of the first substrate 100. The first part 150*v* may be a deep trench isolation (DTI) layer. The first part 150*v*1 may penetrate at least a portion of the first substrate 100. For example, the first part 150*v*1 may have a bottom surface corresponding to the bottom surface TR1*b* of the first trench TR1. The bottom surface of the first part 150*v*1 may be located at a level between the first and second surfaces 100*a* and 100*b* of the first substrate 100. The first part 150*v*1 may have a vertical height H1 less than a vertical thickness of the first substrate 100.

The second part 150*v*2 of the dielectric pattern 150 may be provided in the first substrate 100 and fill the second trench TR2. The second part 150*v*2 may be disposed between the first through structure 70 and the first part 150*v*1 of the dielectric pattern 150. The second part 150*v*2 may overlap vertically with the light-shield layer 60, the first through dielectric layer 73, the bulk color filter 93, the organic layer 95, and the coating layer 97.

The second part 150*v*2 may vertically extend from the first surface 100*a* toward the second surface 100*b* of the first substrate 100. For example, the second part 150*v*2 may have a width that gradually decreases as it extends towards the second surface 100*b* from the first surface 100*a* of the first substrate 100. The second part 150*v*2 may penetrate at least a portion of the first substrate 100. For example, the second part 150*v*2 may have a bottom surface corresponding to the bottom surface TR2*b* of the second trench TR2. The bottom surface of the second part 150*v*2 may be located at a level between the first and second surfaces 100*a* and 100*b* of the first substrate 100. The second part 150*v*2 may have a vertical height H2 less than a vertical thickness of the first substrate 100.

The third part 150*p* of the dielectric pattern 150 may be disposed on the first surface 100*a* of the first substrate 100. The dielectric pattern 150 may include the third part 150*p* at a portion located at a level higher than the first surface 100*a* of the first substrate 100. The third part 150*p* may be a horizontally extending portion of the dielectric pattern 150. The third part 150*p* may horizontally extend to the pixel array area AR, the optical black area OB, and the pad area PAD of the first substrate 100. For example, on the pixel array area AR, the third part 150*p* may be interposed between the antireflective layer 310 and the first surface 100*a* of the first substrate 100. On the optical black area OB and the pad area PAD, the third part 150*p* may be interposed between the light-shield layer 60 and the first surface 100*a* of the first substrate 100. The third part 150*p* may be integrally connected to the first and second parts 150*v*1 and 150*v*2. The third part 150*p* may have a top surface corresponding to the top surface 150*a* of the dielectric pattern 150. The top surface of the third part 150*p* may be substantially flat.

Referring to FIGS. 4A and 5, the height H1 of the first part 150*v*1 of the dielectric pattern 150 may be the same as or greater than the height H2 of the second part 150*v*2 of the dielectric pattern 150. The bottom surface of the first part 150*v*1 may be located at a level the same as or lower than that of the bottom surface of the second part 150*v*2. For example, the height H1 of the first part 150*v*1 may range from about 1 μm to about 10 μm. The height H2 of the second part 150*v*2 may range from about 0.2 μm to about 10 μm. A ratio of the height H2 of the second part 150*v*2 to the height H1 of the first part 150*v*1 may have a value of about 0.1 to 1.

The first part 150*v*1 of the dielectric pattern 150 may have a width W1 at its bottom surface that ranges from about 50 nm to about 500 nm. The second part 150*v*2 of the dielectric pattern 150 may have a width W2 at its bottom surface that ranges from about 50 nm to about 500 nm. For example, a ratio of the width W2 at the bottom surface of the second part 150*v*2 to the width W1 at the bottom surface of the first part 150*v*1 may have a value of about 0.1 to 1.

FIG. 6 is a plan view taken along line II-II' of FIG. 4A or 4B. FIGS. 7 and 8 are plan views taken along line II-II' of FIG. 4A or 4B, showing an image sensor according to other embodiments of the present inventive concepts.

Referring to FIGS. 5 and 6, according to some example embodiments, the second part 150*v*2 of the dielectric pattern 150 may have a grid or lattice shape when viewed in plan. An interval L1 between grids may range from 0.5 μm to about 300 μm.

Referring to FIGS. 5 and 7, according to some example embodiments, the second part 150*v*2 of the dielectric pattern 150 may be provided in plural. The second pans 150*v*2 may be horizontally spaced apart from each other. The second parts 150*v*2 may each have a tetragonal shape when viewed in plan. For example, the second parts 150*v*2 may each have a rectangular shape whose major axis extends in the first direction D1 or the second direction D2. A first group may be defined to include the second parts 150*v*2 having their rectangular shapes whose major axes extend in the first direction D1, and a second group may be defined to include the second parts 150*v*2 having their rectangular shapes whose major axes extend in the second direction D2. The second parts 150*v*2 of the first group may be aligned with each other in the first and second directions D1 and D2, the second parts 150*v*2 of the second group may be aligned with each other in the first and second directions D1 and D2. The second parts 150*v*2 of the first group may be offset in the first and second directions D1 and D2 from the second parts 150*v*2 of the second group. A pair of most adjacent second parts 150*v*2 may have therebetween an interval L1 equal to or less than about 300 µm.

Referring to FIGS. 5 and 8 the second part 150*v*2 of the dielectric pattern 150 may be provided in plural. The second parts 150*v*2 may each have a circular shape when viewed in plan. When viewed in plan, the second parts 150*v*2 may be aligned with each other in the first and second directions D1 and D2. The second parts 150*v*2 may be horizontally spaced apart from each other. For example, an interval L1 between adjacent second parts 150*v*2 may be equal to or less than about 300 µm.

Referring back to FIG. 5, the dielectric pattern 150 may have a triple structure including three layers different from each other. For example, the dielectric pattern 150 may include first, second, and third dielectric patterns 151, 153, and 155 that are sequentially stacked. The first dielectric pattern 151 may be disposed on the first surface 100*a* of the first substrate 100. The first dielectric pattern 151 may cover the first surface 100*a* of the first substrate 100, and may conformally cover an inner sidewall and the bottom surface TR1*b* of the first trench TR1 and an inner sidewall and the bottom surface TR2*b* of the second trench TR2. The first dielectric pattern 151 may contact the first surface 100*a* of the first substrate 100.

The second dielectric pattern 153 may be disposed on the first dielectric pattern 151. The second dielectric pattern 153 may cover a top surface of the first dielectric pattern 151. The second dielectric pattern 153 may extend onto inner sidewalls of the first and second trenches TR1 and TR2, and may cover the inner sidewalls and the bottom surfaces TR1*b* and TR2*b* of the first and second trenches TR1 and TR2.

The third dielectric pattern 155 may be disposed on the second dielectric pattern 153. The third dielectric pattern 155 may cover the first surface 100*a* of the first substrate 100, and may fill the first and second trenches TR1 and TR2. The third dielectric pattern 155 may have a top surface that corresponds to the top surface 150*a* of the dielectric pattern 150 and is substantially flat.

The first, second, and third dielectric patterns 151, 153, and 155 may include different materials from each other. For example, the first, second, and third dielectric patterns 151, 153, and 155 may include one or more of aluminum oxide, hafnium oxide, and silicon oxide.

In some embodiments, the third dielectric pattern 155 may be omitted, and the second dielectric pattern 153 may fill the first and second trenches TR1 and TR2. In this case, the first dielectric pattern 151 and the second dielectric pattern 153 may respectively be called an upper dielectric pattern and a lower dielectric pattern, which upper and lower dielectric patterns may include one or more of aluminum oxide, hafnium oxide, and silicon oxide.

An image sensor may suffer from delamination failure between a substrate and a dielectric layer disposed on a top surface of the substrate. For example, a delamination failure may more frequently occur on the optical black area, where there may be no trench isolation layer, than on a pixel array area, which includes a deep trench isolation layer by which unit pixel regions are divided from each other. Embodiments of the present disclosure provide an image sensor in which pluralities of trenches are formed within the substrate on the optical black area, which reduces delamination failures and increases reliability of the image sensor.

According to some example embodiments, the dielectric pattern 150 may include the first part 150*v* that defines the unit pixel regions PX, and may further include the second part 150*v*2 disposed on the optical black area OB of the first substrate 100. When the dielectric pattern 150 includes the second part 150*v*2, the first surface 100*a* of the first substrate 100 may increase in surface area and may decrease dangling bonds in its vicinity. Therefore, delamination failures may be reduced, and image sensors in accordance with the present inventive concepts may have increased durability, as compared to a case where the dielectric pattern 150 includes the first part 150*v*1 alone.

FIG. 4B illustrates a cross-sectional view of section A of FIG. 3, showing an image sensor according to some example embodiments of the present inventive concepts.

Referring to FIG. 4B, an image sensor according to some example embodiments may include a photoelectric conversion layer 10, a first wiring layer 20, and an upper layer 30. The photoelectric conversion layer 10 may include a first substrate 100, a device isolation pattern 130, a dielectric pattern 150, and gate patterns 170. As FIG. 4B has similar elements to FIG. 4A, duplicate description will be omitted, and differences will be described below.

The first substrate 100, the device isolation pattern 130, the dielectric pattern 150, the first wiring layer 20, and the upper layer 30 may be substantially the same as those discussed with reference to FIGS. 2 to 4A and 5 to 8.

The gate patterns 170 may each have a planar gate structure. Each of the gate patterns 170 may include a horizontal part, but may not include the protruding part discussed in FIGS. 2 and 3. The gate patterns 170 may be located at a level the same as or lower than the second surface 100*b* of the first substrate 100.

Referring back to FIG. 3, the image sensor may include a circuit chip 2000. The circuit chip 2000 may be stacked on a sensor chip 1000. The circuit chip 2000 may include a second wiring layer 50 and a second substrate 40. The second wiring layer 50 may be interposed between the first wiring layer 20 and the second substrate 40. Integrated circuits TR may be disposed on a top surface of the second substrate 40 or in the second substrate 40. The integrated circuits TR may include logic circuits, memory circuits, and combinations thereof. The integrated circuits TR may include, for example, transistors. The second wiring layer 50 may include lower dielectric layers and lower lines 55. The lower lines 55 may be provided between or in the lower dielectric layers. The lower lines 55 may be electrically connected to the integrated circuits TR, and may be coupled to the first and second through structures 70 and 80.

FIGS. 9 to 14 are cross-sectional views showing a method of fabricating an image sensor according to some example embodiments of the present inventive concepts.

Figure 9:
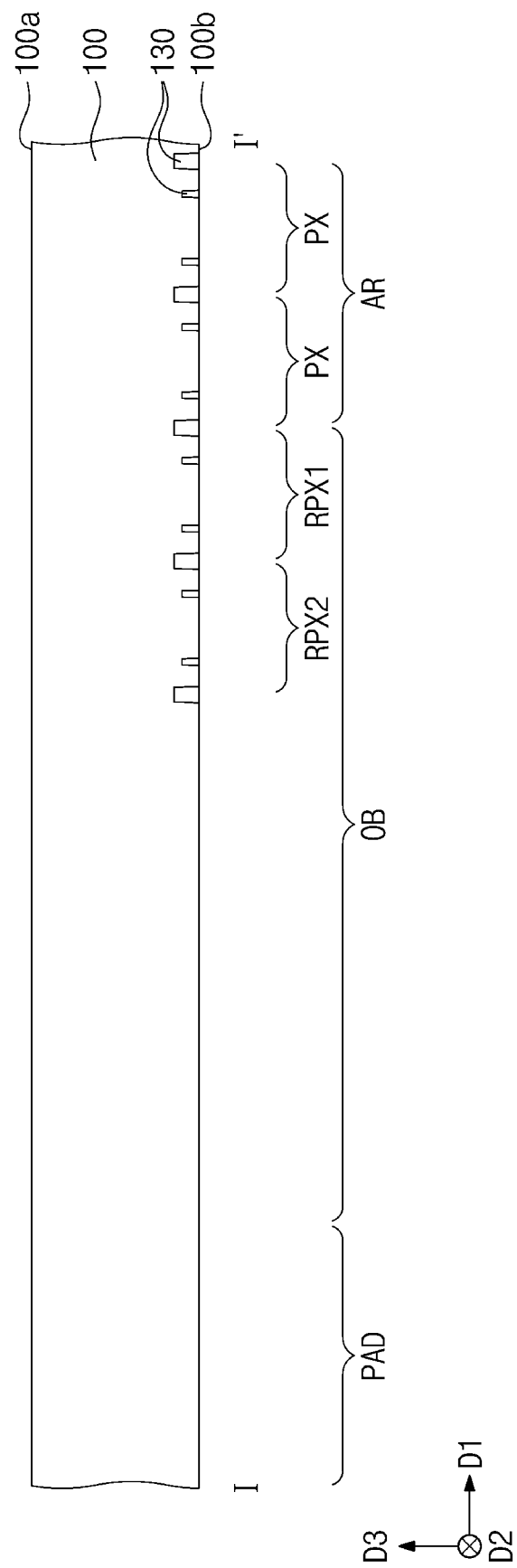
FIGS. 9 to 14 are cross-sectional views showing a method of fabricating an image sensor according to example embodiments of the present inventive concepts.

Referring to FIG. 9, a first substrate 100 may be prepared which has a first surface 100*a* and a second surface 100*b* opposite to the first surface 100*a*. The first substrate 100 may include impurities of a first conductivity type (e.g., p-type). For example, the first substrate 100 may be a substrate in which an epitaxial layer of the first conductivity type is formed on a bulk silicon substrate of the first conductivity type. For another example, the first substrate 100 may be a bulk substrate including a well of the first conductivity type. The first substrate 100 may be divided into a pixel array area AR, an optical black area OB, and a pad area PAD.

Device isolation trenches may be formed on the second surface 100*b* of the first substrate 100. The formation of the device isolation trenches may include forming a mask pattern on the second surface 100b of the first substrate 100 on the pixel array area AR and the optical black area OB, and using the mask pattern to perform an etching process on the second surface 100b.

A preliminary device isolation pattern may be formed on the second surface 100b of the first substrate 100. The preliminary device isolation pattern may be formed by performing a deposition process on the second surface 100b of the first substrate 100. The preliminary device isolation pattern may include, for example, one or more of silicon oxide, silicon nitride, and silicon oxynitride. The preliminary device isolation pattern may completely fill the device isolation trenches. The preliminary device isolation pattern may undergo a grinding or polishing process in which a portion of the preliminary device isolation pattern is removed to form device isolation patterns 130. The device isolation patterns 130 may have their exposed bottom surfaces coplanar with the second surface 100b of the first substrate 100.

Figure 10:
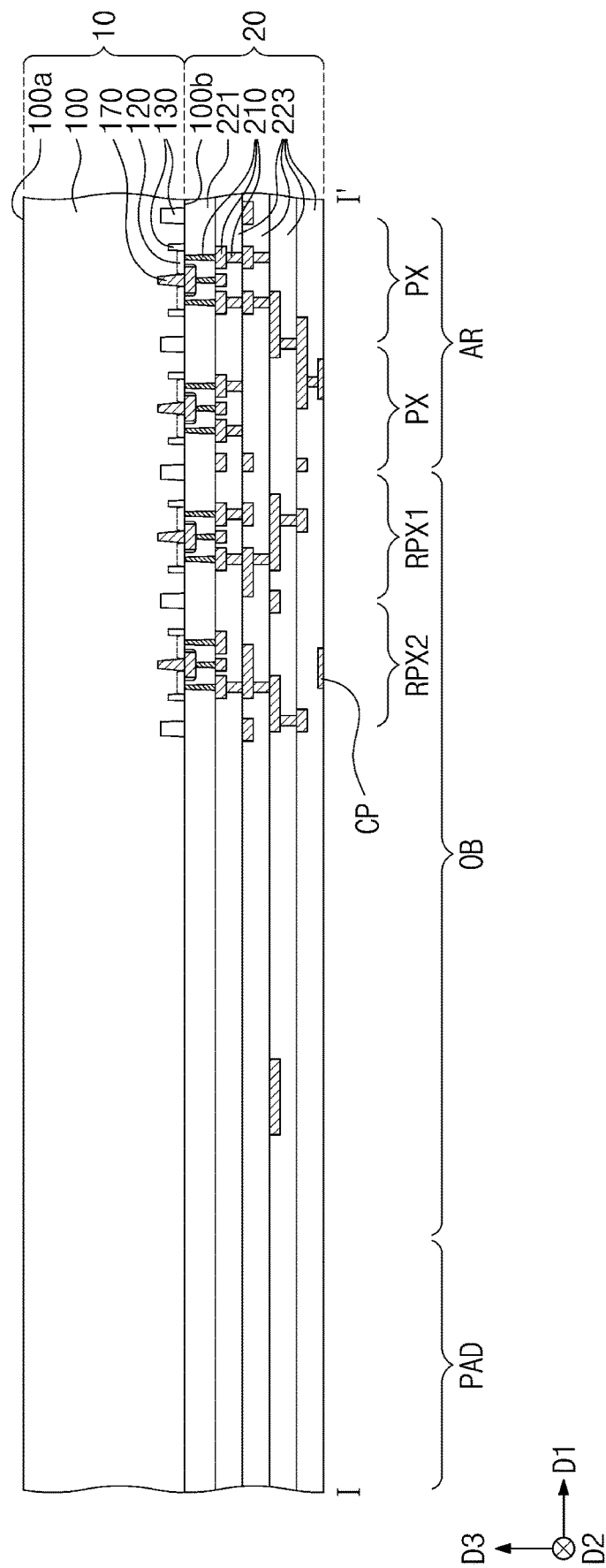

Referring to FIG. 10, transistors may be formed on the second surface 100b of the first substrate 100. The formation of the transistors may include forming gate patterns 170 and forming impurity regions 120 by doping impurities into the second surface 100b of the first substrate 100. The impurity regions 120 may include n-type or p-type impurities.

A first wiring layer 20 may be formed on the first surface 100a of the first substrate 100. The formation of the first wiring layer 20 may include forming a first dielectric layer 221 that covers the device isolation patterns 130 and the gate patterns 170 formed on the second surface 100b of the first substrate 100, forming a contact plug part which penetrates the first dielectric layer 221 of a conductive structure 210, forming a second dielectric layer 223 that covers the contact plug part and the first dielectric layer 221, and forming a line part and a via part of the conductive structure 210 that are disposed in the second dielectric layer 223.

The first dielectric layer 221 and the second dielectric layer 223 may each be formed by performing a process in which a dielectric material is deposited on the second surface 100b of the first substrate 100. The conductive structure 210 may be formed by performing a process in which the first dielectric layer 221 or the second dielectric layer 223 is etched and then a conductive material is deposited.

According to some example embodiments, the second dielectric layer 223 may be provided in plural, and a connection pad CP may be disposed on a lowermost second dielectric layer 223. The connection pad CP may have a bottom surface that is coplanar with that of the lowermost second dielectric layer 223 and is exposed by the lowermost second dielectric layer 223.

Figure 11:
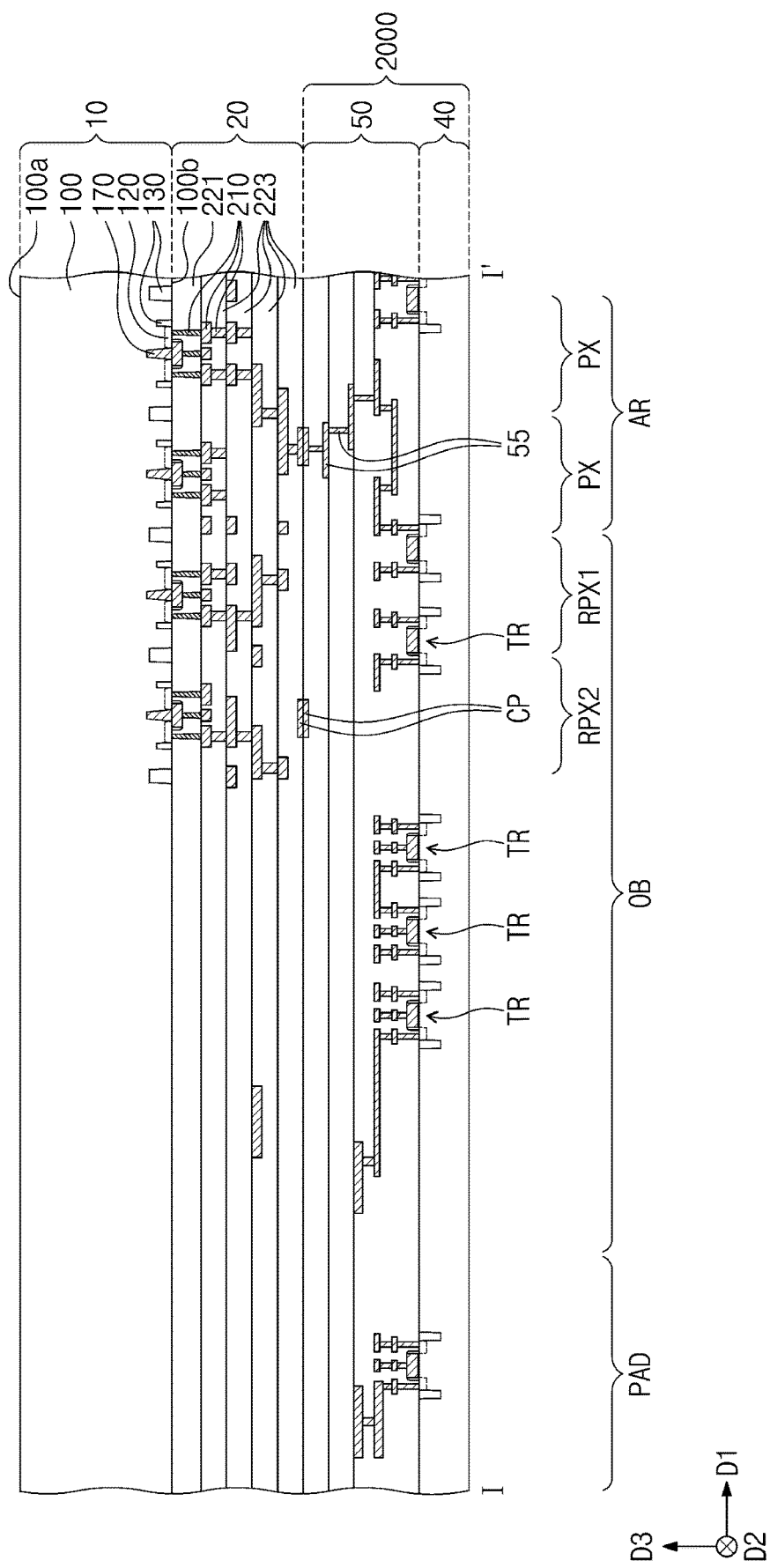

Referring to FIG. 11, a circuit chip 2000 may be prepared. The circuit chip 2000 may be disposed such that a connection pad CP in a second wiring layer 50 of the circuit chip 2000 is vertically aligned with the connection pad CP in the first wiring layer 20. The first substrate 100 may be disposed on a top surface of the circuit chip 2000, and then an annealing process may be performed. The annealing process may be executed such that the connection pad CP in the second wiring layer 50 may be integrally connected to the connection pad CP in the first wiring layer 20. Therefore, the circuit chip 2000 may be rigidly placed on the first substrate 100 and the first wiring layer 20.

Figure 12:
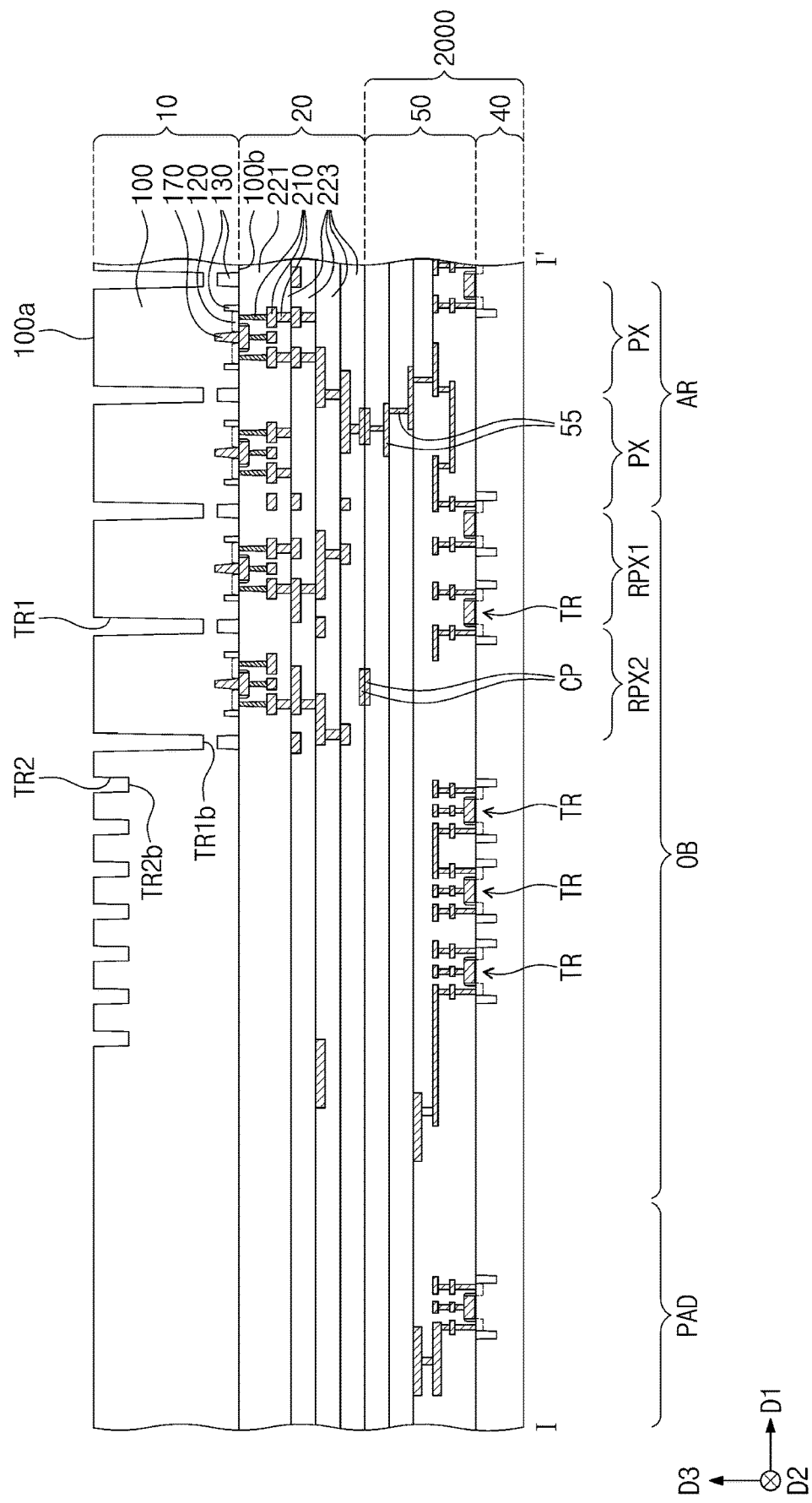

Referring to FIG. 12, a first trench TR1 and a second trench TR2 may be formed on the first surface 100a of the first substrate 100. The formation of the first and second trenches TR1 and TR2 may include forming a mask on the first surface 100a of the first substrate 100 and using the mask to perform an etching process on the first surface 100a.

Figure 13:
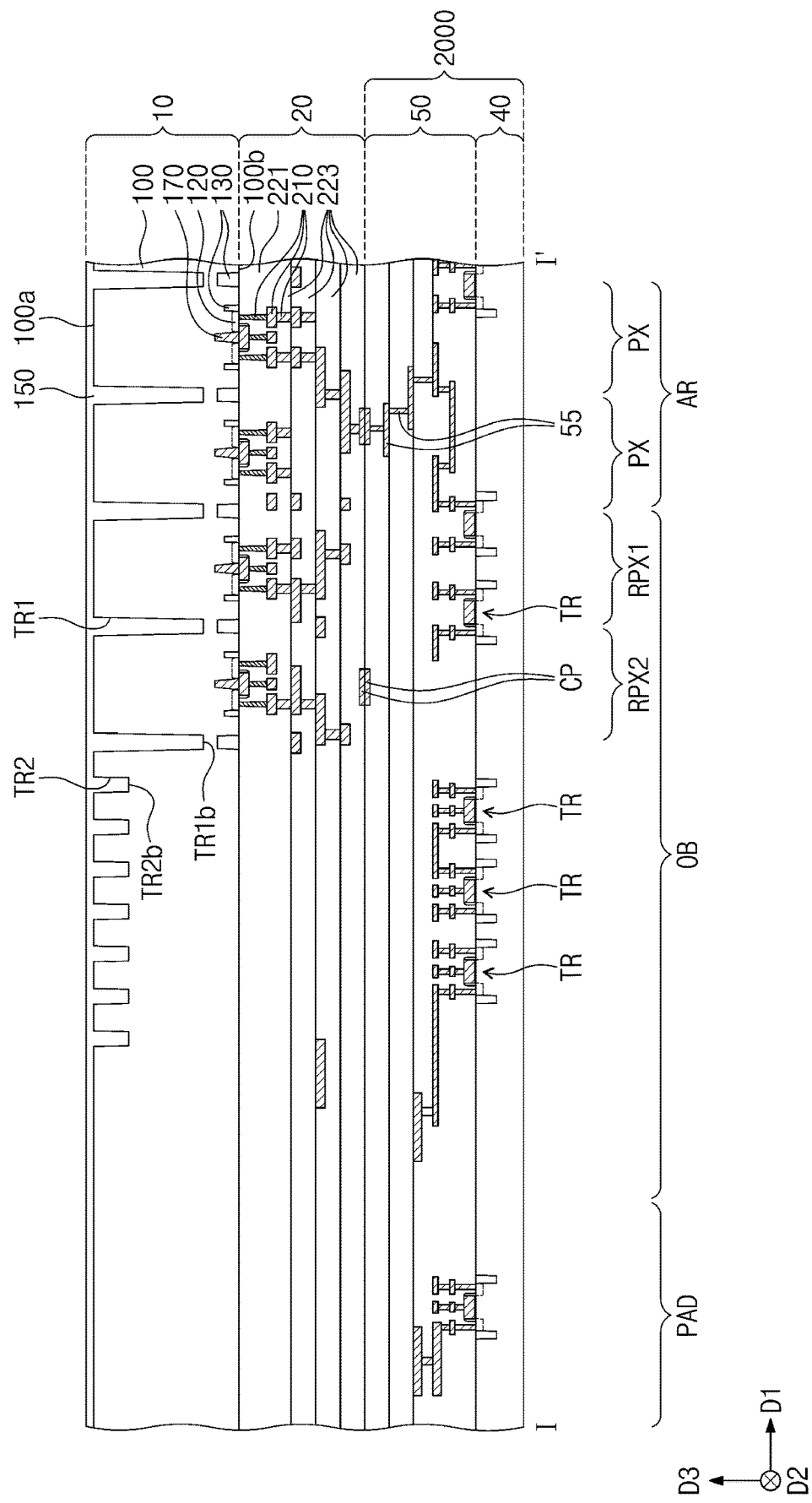

Referring to FIG. 13, a dielectric pattern 150 may be formed by performing a deposition process on the first surface 100a of the first substrate 100. For example, different materials may be used to perform the deposition process several times to form the dielectric pattern 150 that includes first, second, and third dielectric patterns. As shown in FIG. 4A, the deposition process may be executed such that a first dielectric pattern 151 and a second dielectric pattern 153 may be formed to conformally cover an inner sidewall of the first trench TR1 and an inner sidewall of the second trench TR2. The process may be carried out until the first and second trenches TR1 and TR2 are completely filled, with the result that a third dielectric pattern 155 may be formed. After the deposition process is completed, a planarization process may be performed to planarize a top surface 150a of the dielectric pattern 150.

Figure 14:
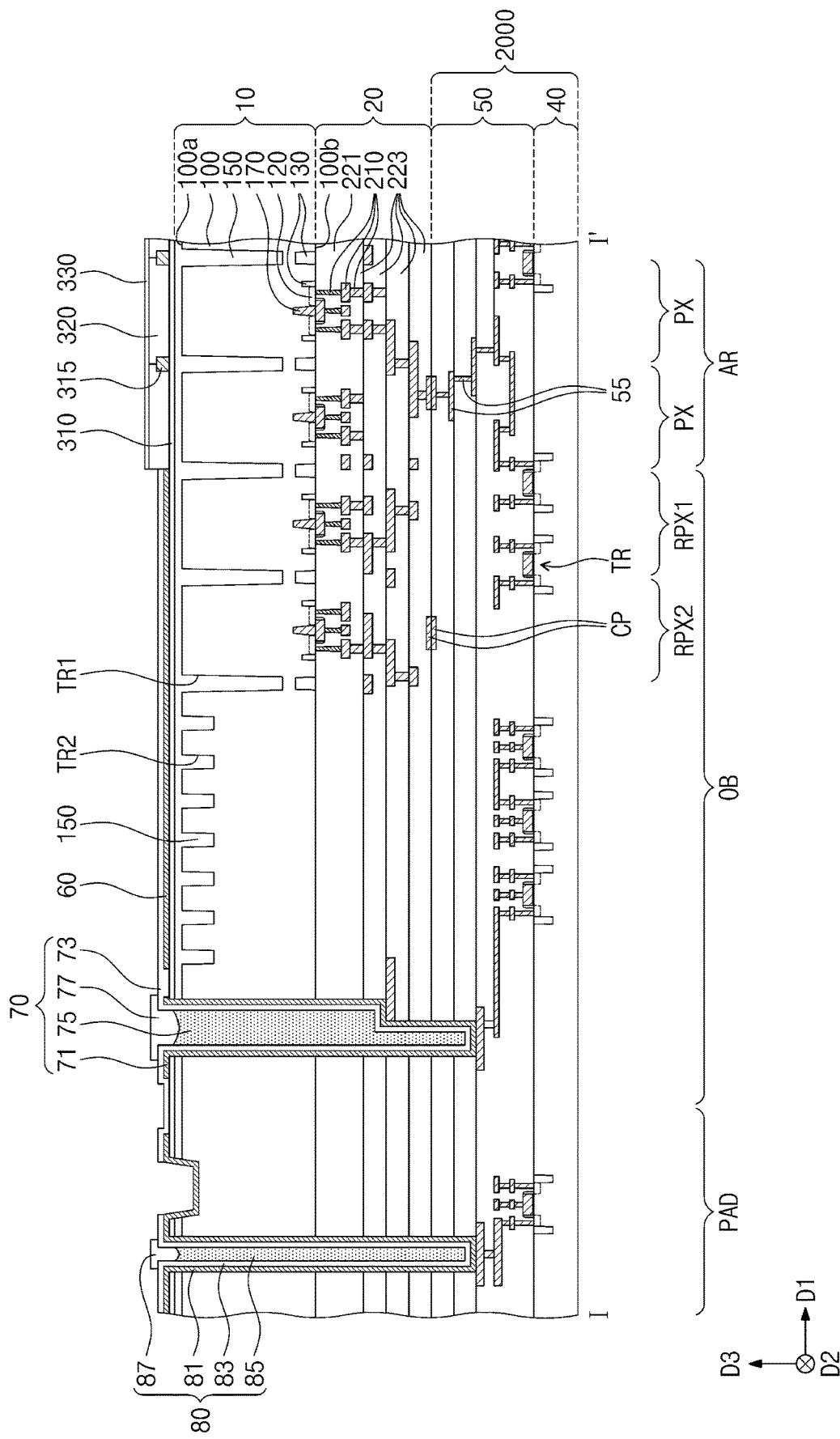

Referring to FIG. 14, an antireflective layer 310, a grid pattern 315, color filters 320, and a backside dielectric layer 330 may be formed on the first surface 100a of the first substrate 100. Afterwards, a light-shield layer 60 and a first through structure 70 may be formed on the optical black area OB of the first substrate 100, and a contact pad trench and a second through structure 80 may be formed on the pad area PAD of the first substrate 100.

Referring back to FIG. 3, micro-lenses 340 may be formed on the color filters 320, and an organic layer 95 may be formed on the optical black area OB and the pad area PAD of the first substrate 100. The micro-lenses 340 and the organic layer 95 may include the same material. Thereafter, a lens coating layer 350 and a coating layer 97 may be formed. Accordingly, an image sensor according to some example embodiments of the present inventive concepts may be fabricated.

An image sensor according to the present inventive concepts may include a substrate including a plurality of trenches on an optical black area. The trenches may increase a surface area at a top surface of the substrate and may decrease dangling bonds adjacent to the top surface of the substrate. Accordingly, delamination between the substrate and a dielectric layer on the substrate may be prevented to provide the image sensor with increased durability.

Although some example embodiments of the present inventive concepts have been discussed with reference to accompanying figures, it will be understood that various changes in form and details may be made therein without departing from the spirit and scope of the present inventive concepts. It therefore will be understood that the embodiments described above are illustrative but not necessarily limitative in all aspects.

What is claimed is:
1. An image sensor, comprising:
a substrate having a first surface and a second surface opposite to the first surface, the substrate including a pixel array area, a pad area, and an optical black area between the pixel array area and the pad area, wherein the optical black area includes a first reference region and a second reference region between the first reference region and the pad area;
a first trench and a second trench in the pixel array area, wherein the first and second trenches are adjacent to each other and in contact with the first surface of the substrate;
a third trench adjacent to the second trench and a fourth trench adjacent to the third trench, wherein the third and fourth trenches are located in the optical black area and are in contact with the first surface of the substrate;
a plurality of trenches including a fifth trench adjacent to the fourth trench and a sixth trench adjacent to the fifth trench, wherein the each of the fifth and sixth trenches is located in the optical black area and is in contact with the first surface of the substrate, wherein a bottom of the fifth trench is closer to the second surface of the substrate than a bottom of the sixth trench and the first, second, third, fourth, fifth and sixth trenches are arranged in order without any intervening trenches in contact with the second surface of the substrate;
a light-shield pattern on the optical black area;
a first dielectric layer on the second surface of the substrate;
a second dielectric layer on the first dielectric layer;
a third dielectric layer on the second dielectric layer;
a first group of line parts and via parts in the first to third dielectric layers under the pixel array area in a plan view;
a second group of line parts and via parts in the first to third dielectric layers under the first reference region in the plan view;
a first photoelectric conversion section between the first trench and the second trench; and
a second photoelectric conversion section between the third trench and the fourth trench;
wherein the line parts and the via parts in the first group have the same shape and placement as the line parts and the via parts in the second group in a vertical view perpendicular to the plan view,
wherein the first to third dielectric layers under the second reference region in the plan view do not include line parts and via parts having the same shape and placement as the line parts and the via parts in the first or second group in the vertical view, and
wherein the plurality of trenches in the second reference region include four trenches.

2. The image sensor of claim 1, further comprising:
a first dielectric pattern; and
a second dielectric pattern,
wherein the first and second dielectric patterns fill a sidewall of the first trench, a sidewall of the third trench, a sidewall of the fifth trench, and a sidewall of the sixth trench, and
wherein the first and second dielectric patterns are on the first surface of the substrate.

3. The image sensor of claim 2, wherein the first dielectric pattern includes aluminum oxide.

4. The image sensor of claim 3, wherein the second dielectric pattern includes silicon oxide, and
wherein the first dielectric pattern is between the first surface of the substrate and the second dielectric pattern.

5. The image sensor of claim 4, wherein the plurality of trenches in the second reference region include six trenches.

6. The image sensor of claim 4, wherein the first dielectric pattern has a first bottom surface in the first trench and a second bottom surface in the third trench,
wherein the first bottom surface in the first trench is spaced apart from the first second surface of the substrate, and
wherein the second bottom surface in the third trench is spaced apart from the first second surface of the substrate.

7. The image sensor of claim 6, further comprising:
a third dielectric pattern between the first dielectric pattern and the second dielectric pattern in the first to third trenches.

8. The image sensor of claim 7, wherein the first dielectric pattern has a third bottom surface in the fifth trench, and
wherein the third bottom surface in the fifth trench is spaced apart from the first second surface of the substrate.

9. The image sensor of claim 8, wherein a distance from the first bottom surface in the first trench to the second surface of the substrate in a first direction is the same as a distance from the second bottom surface in the third trench to the second surface of the substrate in a first direction.

10. The image sensor of claim 8, wherein a width of the first bottom surface in the first trench in a second direction perpendicular to the first direction is the same as a width of the second bottom surface in the third trench in the second direction, and
wherein the width of the first bottom surface in the first trench in the second direction is the same as a width of the third bottom surface in the fifth trench in the second direction.

11. The image sensor of claim 10, wherein the width of the first bottom surface in the first trench in the second direction is about from 50 nm to about 500 nm.

12. The image sensor of claim 9, wherein the distance from the first bottom surface in the first trench to the second surface of the substrate in the first direction is from about 1 μm to about 10 μm.

13. The image sensor of claim 12, wherein a distance from the third bottom surface in the fifth trench to the second surface of the substrate in the first direction is not shorter than the distance from the second bottom surface in the third trench to the second surface of the substrate in the first direction.

14. The image sensor of claim 12, wherein the light-shield pattern includes tungsten.

15. An image sensor, comprising:
a substrate having a first surface and a second surface opposite to the first surface, the substrate including a pixel array area, a pad area, and an optical black area between the pixel array area and the pad area, wherein the optical black area includes a first reference region and a second reference region between the first reference region and the pad area;
a first trench and a second trench in the pixel array area, wherein the first and second trenches are adjacent to each other and in contact with the first surface of the substrate;
a third trench adjacent to the second trench and a fourth trench adjacent to the third trench, wherein the third and fourth trenches are in contact with the first surface of the substrate;
a plurality of trenches including a fifth trench adjacent to the fourth trench and a sixth trench adjacent to the fifth trench, wherein the each of the first and sixth trenches is located in the optical black area and is in contact with the first surface of the substrate, wherein a bottom of the fifth trench is closer to the second surface of the substrate than a bottom of the sixth trench and the first, second, third, fourth, fifth and sixth trenches are arranged in order without any intervening trenches in contact with the second surface of the substrate;

a light-shield pattern on the optical black area;
a first dielectric layer on the second surface of the substrate;
a second dielectric layer on the first dielectric layer;
a third dielectric layer on the second dielectric layer;
a first group of line parts and via parts in the first to third dielectric layers under the pixel array area in a plan view;
a second group of line parts and via parts in the first to third dielectric layers under the first reference region in the plan view;
a first photoelectric conversion section between the first trench and the second trench; and
a second photoelectric conversion section between the third trench and the fourth trench,
a first dielectric pattern in the first trench, the third trench, the fifth trench, and the sixth trench;
a second dielectric pattern in the first trench, the third trench, the fifth trench, and the sixth trench; and
a third dielectric pattern in the first trench, the third trench, the fifth trench, and the sixth trench,
wherein the line parts and the via parts in the first group have the same shape and placement as the line parts and the via parts in the second group in a vertical view perpendicular to the plan view,
wherein the first to third dielectric layers under the second reference region in the plan view do not include line parts and via parts having the same shape and placement as the line parts and the via parts in the first or second group in the vertical view, and
wherein the plurality of trenches in the second reference region include four trenches.

16. The image sensor of claim 15, wherein the first dielectric pattern includes aluminum oxide, and
wherein the second dielectric pattern includes silicon oxide.

17. The image sensor of claim 16, wherein the first dielectric pattern has a third bottom surface in the fifth trench,
wherein the third bottom surface in the fifth trench is spaced apart from the first second surface of the substrate.

18. The image sensor of claim 17, wherein the first dielectric pattern has a first bottom surface in the first trench and a second bottom surface in the third trench, and
wherein a distance from the first bottom surface in the first trench to the second surface of the substrate in a first direction is same as a distance from the second bottom surface in the third trench to the second surface of the substrate in a first direction.

19. The image sensor of claim 17, wherein the plurality of trenches in the second reference region include seven trenches.

20. The image sensor of claim 18, wherein a width of the first bottom surface in the first trench in a second direction perpendicular to the first direction is the same as a width of the second bottom surface in the third trench in the second direction, and
wherein the width of the first bottom surface in the first trench in the second direction is the same as a width of the third bottom surface in the fifth trench in the second direction.

* * * * *